United States Patent [19]

Takakusagi

[11] Patent Number: 4,774,717
[45] Date of Patent: Sep. 27, 1988

[54] DOUBLE-CURRENT DETECTOR

[75] Inventor: Hideo Takakusagi, Tokyo, Japan

[73] Assignee: Oki Electric Industry Co., Ltd., Tokyo, Japan

[21] Appl. No.: 82,314

[22] Filed: Aug. 6, 1987

[30] Foreign Application Priority Data

Aug. 18, 1986 [JP] Japan .................... 61-191703

[51] Int. Cl.$^4$ ............................................. H04L 27/06
[52] U.S. Cl. ........................................ 375/94; 328/32; 455/619
[58] Field of Search ................ 375/36, 97; 307/260, 307/261; 328/28, 32; 455/613, 617, 619

[56] References Cited

U.S. PATENT DOCUMENTS

| | | | |
|---|---|---|---|
| 3,535,556 | 10/1970 | Hall | 328/32 |
| 3,723,765 | 3/1973 | Kautz et al. | 328/32 |
| 4,012,702 | 3/1977 | Weber | 328/32 |
| 4,117,757 | 10/1978 | Akamatu | 328/32 |
| 4,507,571 | 3/1985 | Callan | 307/261 |
| 4,575,643 | 3/1986 | Sakai | 307/261 |
| 4,672,642 | 6/1987 | Willis et al. | 307/261 |

Primary Examiner—Robert L. Griffin
Assistant Examiner—Stephen Chin
Attorney, Agent, or Firm—Wenderoth, Lind & Ponack

[57] ABSTRACT

A double-current detector for generating a rectangular waveform signal substantially in phase with a received double-current signal has a full-wave rectifying bridge circuit having a pair of AC terminals for receiving the double-current signal therebetween, a pair of DC terminals, a first photocoupler including a light-emitting element connected between the DC terminals, and a second photocoupler including a light-emitting element connected in one arm of the bridge circuit. An increase in the double-current signal is detected by using an output signal from the first photocoupler, and the polarity of the double-current signal is detected by using an output signal from the second photocoupler. In response to signals indicative of the increase and polarity of the double-current signal, a logic circuit controls a flip-flop to produce an output signal as the rectangular waveform signal.

3 Claims, 2 Drawing Sheets

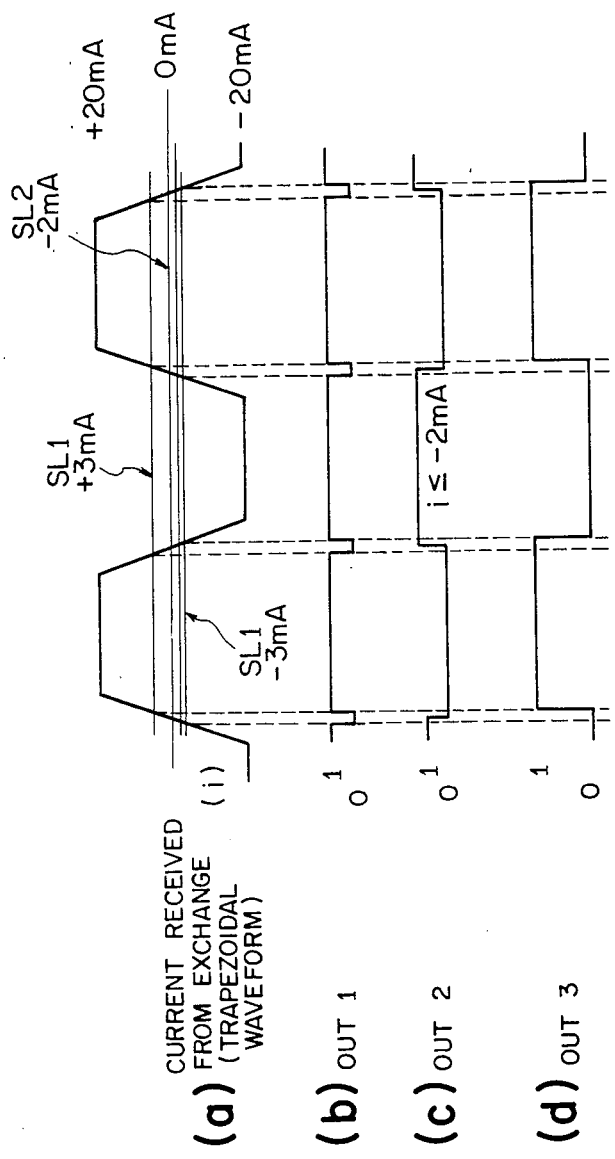

DOUBLE-CURRENT DETECTOR

BACKGROUND OF THE INVENTION

The present invention relates to a double-current detector, and more particularly to a double-current detector for shaping a double-current signal transmitted through a line of a data transmission system such as telex, for example.

Some conventional double-current detectors for producing a rectangular wave substantially in synchronism with a received double-current signal from a data transmission system include rheostats or variable resistors for adjusting positive and negataive slice levels employed by comparators which compare output signals from photocouplers with such slice levels. However, the use of such rheostats has been disadvantageous in that the cost of the double-current detectors is high, and slice level adjustments are necessary. Furthermore, characteristic variations of the photocouplers must be small.

SUMMARY OF THE INVENTION

It is an object of the present invention to provide a double-current detector which requires no rheostats for adjusting slice levels for signal level comparison.

Another object of the present invention is to provide a double-current detector which is inexpensive to manufacture.

Still another object of the present invention is to provide a double-current detector which is substantially free from limitations as to characteristic variations of photocouplers used.

According to the present invention, a double-current detector for generating a rectangular waveform signal substantially in phase with a received double-current signal has a full-wave rectifying bridge circuit having a pair of AC terminals for receiving the double-current signal therebetween, a pair of DC terminals, a first photocoupler including a light-emitting element connected between the DC terminals, and a second photocoupler including a light-emitting element connected in one arm of the bridge circuit. The double-current detector also includes first means responsive to an output signal from the first photocoupler for generating a first signal indicative of an increase in the double-current signal, second means responsive to an output signal from the second photocoupler for generating a second signal indicative of the polarity of the double-current signal, a flip-flop, and circuit means responsive to the first and second signals for controlling the flip-flop to produce an output signal as the rectangular waveform signal.

The current which flows through the first light-emitting element goes in one direction only irrespective of whether a positive or negative current flows between the AC terminals. Increases in the positive and negative currents are thus detected by the same first photocoupler in combination with the first means. Therefore, positive and negative slice levels used by the first means automatically remain the same without adjustments which would otherwise be carried out by rheostats. The double-current detector is also substantially free from characteristic variations of the first and second photocouplers.

The polarity of the current is detected by the second photocoupler. The rectangular waveform signal can be generated substantially in synchronism with the received double-current signal based on the result of detection of the current increase using the first photocoupler and the result of detection of the current polarity using the first photocoupler.

The above and other objects, features and advantages of the present invention will become more apparent from the following description when taken in conjunction with the accompanying drawings in which a preferred embodiment of the present invention is shown by way of illustrataive example.

BRIEF DESCRIPTION OF THE DRAWINGS

FIG. 2 is a timing chart showing operation of the double-current detector shown in FIGS. 1A and 1B.

DESCRIPTION OF THE PREFERRED EMBODIMENT

Figure 1A:
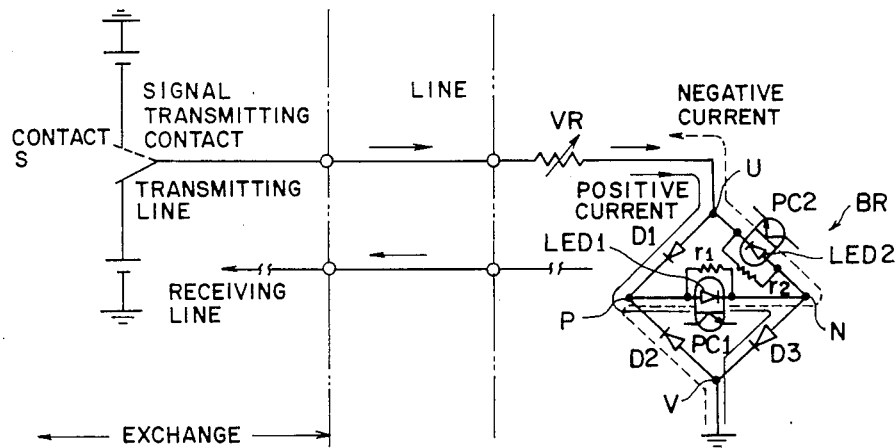
FIGS. 1A and 1B are respectively circuit diagram of a double-current detector according to the present invention.
Figure 1B:
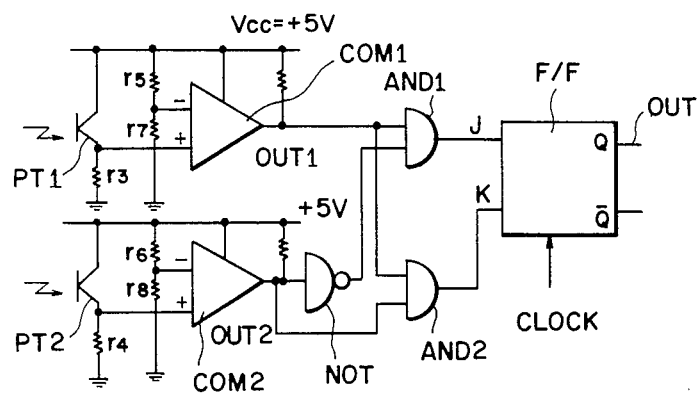

As shown in FIGS. 1A and 1B, a double-current detector according to an embodiment of the present invention has a full-wave rectifying bridge circuit BR having an AC terminal U coupled through a variable resistor or rheostat VR to a line of a data transmission system such as a telex and an AC terminal V connected to ground. The rectifying bridge circuit BR also has a pair of diagonal DC terminals P, N between which a light-emitting element such as a light-emitting diode LED 1 of a photocoupler PC 1 is connected, the light-emitting diode LED 1 being shunted by resistor r1.

The rectifying bridge circuit BR has three arms or branches having respective diodes D1, D2, D3 and a fourth arm comprising a light-emitting element such as a light-emitting diode LED 2 of a photocoupler PC 2 and a resistor r2 connected across the light-emitting diode LED 2. The diode D1 is connected between the terminals U, P, and the diode D2 is connected between the terminals P, V. The diode D3 is connected between the terminals V, N, and the light-emitting diode LED 2 is connected between the terminals N, U.

The diodes D1, D2, D3 and the light-emitting diodes LED 1 are oriented such that both a positive current flowing between the AC terminals U, V and a negative current flolwing between the AC terminals U, V will flow through the light-emitting diode LED 1 in the forward direction thereof, and only a negative current flowing between terminals U, V will flow through the light-emitting diode LED 2 in its forward direction.

The resistors r1, r2 connected across the respective light-emitting diodes LED1, LED2 have resistances selected to meet the following relationship:

$$r1 < r2$$

The photocouplers PC1, PC2 have respective light detectors such as phototransistors PT1, PT2. The phototransistors PT1, PT2 have collectors connected to a power supply Vcc (=5 V), and emitters connected to ground through resistors r3, r4, respectively, the emitters being also coupled to the positive input terminals, respectively, of comparators COM1, COM2. The comparators COM1, COM2 have negative input terminals supplied with output reference signals from respective voltage dividers that comprise series-connected resistors r5, r7 and series-connected resistors r6, r8, respectively, which are joined to the power supply Vcc.

The comparatos COM1, COM2 produce a signal of logic level "1" at their respective output terminals OUT1, OUT2 when the signals applied to their positive input terminals are greater than the reference signals applied to their negative input terminals.

The resistors r5, r7 are of such resistances that when a current equal to or greater than 3 mA flows through the light-emitting diode LED1, the signal applied to the positrive input terminal of the comparator COM1 is higher than the signal applied to the negative input terminal thereof. The resistors r6, r8 are of such resistances that when a current equal to or greater than 2 mA flows through the light-emitting diode LED2, the signal applied to the positive input terminal of the comparator COM2 is higher than the signal applied to the negative input terminal thereof.

The output signals from the comparatos COM1, COM2 are applied to an AND gate AND2. The output signal from the AND gate AND2 is applied to a K input terminal of a JK flip-flop F/F. The output signal from the comparator COM2 is applied via an inverter NOT to an AND gate AND1, to which the output signal from the comparator COM1 is also supplied. The output terminal of the AND gate AND1 is connected to a J input terminal of the JK flip flop F/F.

FIG. 2 shows the waveforms of various signals produced in the double-current detector illustrated in FIGS. 1A and 1B. The double-current detector of the invention serves to shape and convert a double-current signal (a) to a rectangular waveform signal (d) in FIG. 2.

A double-current signal transmitted through a line from an exchange is normally of about 20 mA. During a period in which a positive current (indicated by the solid line in FIG. 1A) flows between the AC terminals U, V, the current flows from the diode D1 through the light-emitting diode LED 1 or its parallel-connected resistor r1 to the diode D3. While a negative current (indicated by the broken line in FIG. 1A) is flowing between the AC terminals U, V, the current flows from the diode D2 through the light-emitting diode LED1 or its parallel-connected resistor r1 to the light-emitting diode LED2 or its parallel-connected resistor r2. Therefore, a current flows through the light-emitting diode LED1 in its forward direction irrespective of whether the current is positive or negative. Thus, whenever the magnitude of the received current exceed a first prescribed slice level SL1 irrespective of whether the received current is positive or negative, the comparator COM1 produces an output signal of "1" (as shown at (b) in FIG. 2).

A current flows through the light-emitting diode LED2 only when the current flowing between the AC terminals U, V is negative. Accordingly, whenever the received current is negative and its magnitude exceeds a second prescribed slice level SL2, the comparator COM2 produces an output signal of "1" (as shown at (c) in FIG. 2).

The second slice level SL2 is smaller than the first slice level SL1 so that the output signal from the comparator COM2 becomes "1" earlier than the output signal from the comparator COM1. In the illustrated embodiment, the first slice level SL1 is 3 mA whereas the second slice level SL2 is −2 mA. The resistance of the resistor r2 is greater than the resistance of the resistor r1 to ensure that the light-emitting diode LED 2 is rendered conductive earlier than the light-emitting diode LED 1.

When a positive current increases until it exceed the first slice level SL1 (3 mA), the output OUT1 from the comparator COM1 goes high ("1"). At this time, the output OUT2 of the comparator COM2 remains low. The output OUT1 and an inverted signal of the output OUT2 from the inverter NOT are ANDed by the AND gate AND1 which produces an output signal of "1". The outputs OUT1, OUT2 are ANDed by the AND gate AND2 which produces an output signal of "0". Therefore, the output OUT from the flip-flop F/F becomes "1" in synchronism with a next clock pulse.

When a negative current increases, the output OUT2 becomes "1" and then the output OUT1 becomes "1". The AND gate AND2 by which the outputs OUT2, OUT1 are ANDed produces an output signal of "1", and the AND gate AND1 by which the output OUT1 and an inverted signal of the output OUT2 are ANDed produces an output signal of "0". Consequently, the output OUT from the flip-flop F/F becomes "0" in synchronism with a next clock pulse.

The aforesaid cycle of operation is repeated to enable the flip-flop F/F to generate a rectangular waveform signal which is substantially synchronous or in phase with the received current signal.

The current which flows through the light-emitting diode LED1 goes in one direction only irrespective of whether a positive or negative current flows between the AC terminals U, V. Increases in the positive and negative currents are thus detected by the same photocoupler PC1 in combination with the comparator COM1. Therefore, the positive and negative slice levels automatically remain the same without adjustments which would otherwise be carried out by rheostats. The double-current detector is also substantially free from limitations arising from characteristic variations of the photocouplers PC1, PC2.

Although a certain preferred embodiment has been shown and described, it should be understood that many changes and modifications may be made therein without departing from the scope of the appended claims.

What is claimed is:

1. A double-current detector for generating a rectangular waveform signal substantially in phase with a received double-current signal, comprising;

a full-wave rectifying bridge circuit having a pair of AC terminals for receiving the double-current signal therebetween, a pair of DC terminals, a first photocoupler including a light-emitting element connected between said DC terminals, and a second photocoupler including a light-emitting element connected in one arm of the bridge circuit;

first means responsive to an output signal from said first photocoupler for generating a first signal indicative of an increase in said double-current signal;

second means responsive to an output signal from said second photocoupler for generating a second signal indicative of the polarity of said double-current signal;

a flip-flop; and circuit means responsive to said first and second signals for controlling said flip-flop to produce an output signal as the rectangular waveform signal.

2. A double-current detector according to claim 1, wherein said first and second means comprise first and second comparators, respectively, said circuit means including an inverter having an input terminal connected to an output terminal of said second comparator, a first AND gate having an input terminal connected to an output terminal of said first comparator and another input terminal connected to an output terminal of said inverter, and a second AND gate having an input terminal connected to the output terminal of said first comparator and another input terminal connected to the output terminal of said second comparator, said first and second AND gates having respective output terminals coupled to said flip-flop.

3. A double-current detector according to claim 2, wherein said flip-flop comprises a J-K flip-flop having a J input terminal connected to the output terminal of said first AND gate and a K input terminal connected to the output terminal of said second AND gate.

* * * * *